United States Patent
Nam

(10) Patent No.: US 8,173,497 B2
(45) Date of Patent: May 8, 2012

(54) SEMICONDUCTOR DEVICE PREVENTING FLOATING BODY EFFECT IN A PERIPHERAL REGION THEREOF AND METHOD FOR MANUFACTURING THE SAME

(75) Inventor: Ki Bong Nam, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 432 days.

(21) Appl. No.: 12/333,394

(22) Filed: Dec. 12, 2008

(65) Prior Publication Data

US 2009/0302356 A1 Dec. 10, 2009

(30) Foreign Application Priority Data

Jun. 5, 2008 (KR) ........................ 10-2008-0052886

(51) Int. Cl.
*H01L 21/84* (2006.01)

(52) U.S. Cl. ........ 438/154; 438/238; 438/241; 438/275; 438/413; 438/479; 438/739; 257/E21.102; 257/E21.633

(58) Field of Classification Search ................... 438/479, 438/481, 154, 164, 238, 241, 275, 405, 413, 438/492, 739, 166, 300; 257/350, 351, 352, 257/E21.633, E21.102, E21.104, E21.238, E21.257, E21.258

See application file for complete search history.

(56) References Cited

U.S. PATENT DOCUMENTS

| | | | | |
|---|---|---|---|---|
| 6,998,684 B2 * | 2/2006 | Anderson et al. | ............. | 257/351 |
| 7,435,639 B2 * | 10/2008 | Winstead et al. | ............. | 438/199 |
| 2003/0032262 A1 | 2/2003 | Dennison et al. | | |
| 2006/0073646 A1 * | 4/2006 | Yang | ............................. | 438/152 |
| 2007/0048919 A1 * | 3/2007 | Adetutu et al. | ............... | 438/199 |

FOREIGN PATENT DOCUMENTS

| KR | 1020010038179 A * | 5/2001 |
|---|---|---|
| KR | 1020010045580 A | 6/2001 |
| KR | 1020050062967 A | 6/2005 |

* cited by examiner

*Primary Examiner* — Julio J Maldonado
(74) *Attorney, Agent, or Firm* — Ladas & Parry LLP

(57) ABSTRACT

A semiconductor device having a cell region and a peripheral region includes an silicon on insulator (SOI) substrate having a stack structure of a silicon substrate, a buried insulation layer, and a silicon layer. An epi-silicon layer is formed in the buried insulation layer of the peripheral region and connects a peripheral portion of a channel area of the silicon layer to the silicon substrate. A gate is formed on the silicon layer and junction areas are formed in the silicon layer on both sides of the gate.

10 Claims, 8 Drawing Sheets

SEMICONDUCTOR DEVICE PREVENTING FLOATING BODY EFFECT IN A PERIPHERAL REGION THEREOF AND METHOD FOR MANUFACTURING THE SAME

CROSS-REFERENCE TO RELATED APPLICATIONS

The present application claims priority to Korean patent application number 10-2008-0052886 filed on Jun. 5, 2008, which is incorporated herein by reference in its entirety.

BACKGROUND OF THE INVENTION

The present invention relates generally to a semiconductor device and a method for manufacturing the same, and more particularly to a semiconductor device capable of preventing a floating body effect in a peripheral region, thereby improving the operation characteristics thereof, and a method for manufacturing the same.

Current design trends in semiconductor devices include increasing the level of integration, increasing operation speed, and reducing power consumption. As the above design trends continue, a semiconductor device using a silicon-on-insulator (SOI) substrate, in place of the typical substrate made of bulk silicon, has been highlighted in the art. A device formed on the SOI substrate provides advantages over a device formed on the substrate made of bulk silicon in that it is possible to accomplish high speed operation through utilization of a small junction capacitance, accomplish voltage reduction through utilization of a low threshold voltage, and accomplish prevention of a latch-up phenomenon through utilization of complete isolation.

A conventional SOI device includes an SOI substrate having a structure in which a buried oxide layer and a silicon layer are sequentially stacked on a silicon substrate, gates which are formed on the silicon layer of the SOI substrate, and junction areas which are formed in the silicon layer on both sides of the gates such that the lower ends of the junction areas come into contact with the buried oxide layer. In the conventional SOI device, the portions of the silicon layer which are placed under the gates, that is, the bodies of transistors, are floated by the presence of the junction areas and the buried oxide layer.

Therefore, since the conventional SOI device has an floating body cell (FBC) structure in which the bodies are floated, charges can be stored in the floated bodies, and therefore, the size of cells can be decreased because it is not necessary to separately form capacitors for storing charges.

However, in the conventional SOI device, which include bodies having the floating structure in both a cell region and in a peripheral region, an undesired floating body effect can be caused in the peripheral region, and due to this, mis-operation of the device is likely to occur. That is, when the floating body effect is caused in the peripheral region, transistors in the peripheral region operate and current flows from drain areas to source areas, charges are stored in the bodies and the voltages of the bodies decrease. Consequently, as electron holes are temporarily discharged to the source areas, mis-operation is likely to occur.

As a result, in the conventional SOI device, due to the fact that the undesired floating body effect may occur in the peripheral region leading to device mis-operation, whereby the operation characteristics of the SOI device may deteriorate.

SUMMARY OF THE INVENTION

Embodiments of the present invention include a semiconductor device that can prevent a floating body effect in a peripheral region and a method for manufacturing the same.

Also, embodiments of the present invention include a semiconductor device that can improve the operation characteristics of transistors in a peripheral region and a method for manufacturing the same.

In one aspect of the present invention, a semiconductor device comprises an SOI substrate having a stack structure of a silicon substrate, a buried insulation layer and a silicon layer, and possessing a cell region and a peripheral region; an epi-silicon layer formed in the buried insulation layer of the peripheral region and connecting a peripheral portion of a channel area of the silicon layer with the silicon substrate; a gate formed on the silicon layer; and junction areas formed in the silicon layer on both sides of the gate.

The epi-silicon layer is located to overlap with the peripheral portion of the channel area of the silicon layer.

The junction areas are formed to come into contact with the buried insulation layer.

The semiconductor device further comprises an isolation layer formed in the silicon layer to delimit an active area in which the peripheral portion of the channel area is connected with the epi-silicon layer.

In another aspect of the present invention, a method for manufacturing a semiconductor device comprises the steps of preparing an SOI substrate which has a stack structure of a silicon substrate, a buried insulation layer and a silicon layer and possesses a cell region and a peripheral region; forming an epi-silicon layer in the buried insulation layer of the peripheral region to connect a peripheral portion of a channel area of the silicon layer with the silicon substrate; forming a gate on the silicon layer; and forming junction areas in the silicon layer on both sides of the gate.

The epi-silicon layer is formed to overlap with the peripheral portion of the channel area of the silicon layer.

The step of forming the epi-silicon layer comprises the steps of defining a groove by etching the silicon layer and the buried insulation layer in the peripheral region to expose the silicon substrate; and growing an epi-silicon layer in the groove.

The step of defining the groove comprises the steps of forming a first anti-growth film on the silicon layer to expose a portion of the silicon layer in the peripheral region; defining a first groove in the silicon layer by etching the exposed portion of the silicon layer to expose the buried insulation layer; forming a second anti-growth film on sidewalls of the first groove; defining a second groove in the buried insulation layer by etching an exposed portion of the buried insulation layer to expose the silicon substrate; and etching the buried insulation layer such that the second groove has a width greater than that of the first groove.

The first anti-growth film and the second anti-growth film comprise nitride layers.

The first anti-growth film and the second anti-growth film are formed to a thickness of 30~100 Å.

The step of etching the buried insulation layer such that the second groove has a width greater than that of the first groove is implemented through isotropic etching.

The isotropic etching is conducted through a wet cleaning process.

The step of growing the epi-silicon layer is implemented through a selective epitaxial growth process.

After the step of growing the epi-silicon layer, the method comprises the step of removing the epi-silicon layer through a CMP process until the silicon layer is exposed.

After the step of growing the epi-silicon layer and before the step of forming the gate, the method further comprises the step of forming an isolation layer in the silicon layer to delimit an active area in which the peripheral portion of the channel area is connected with the epi-silicon layer.

The junction areas are formed to come into contact with the buried insulation layer.

DESCRIPTION OF SPECIFIC EMBODIMENTS

Hereafter, specific embodiments of the present invention will be described in detail with reference to the accompanying drawings. In the accompanying drawings broken lines are used for clarity to show portions of elements that are hidden from view by other elements.

Figure 1A:
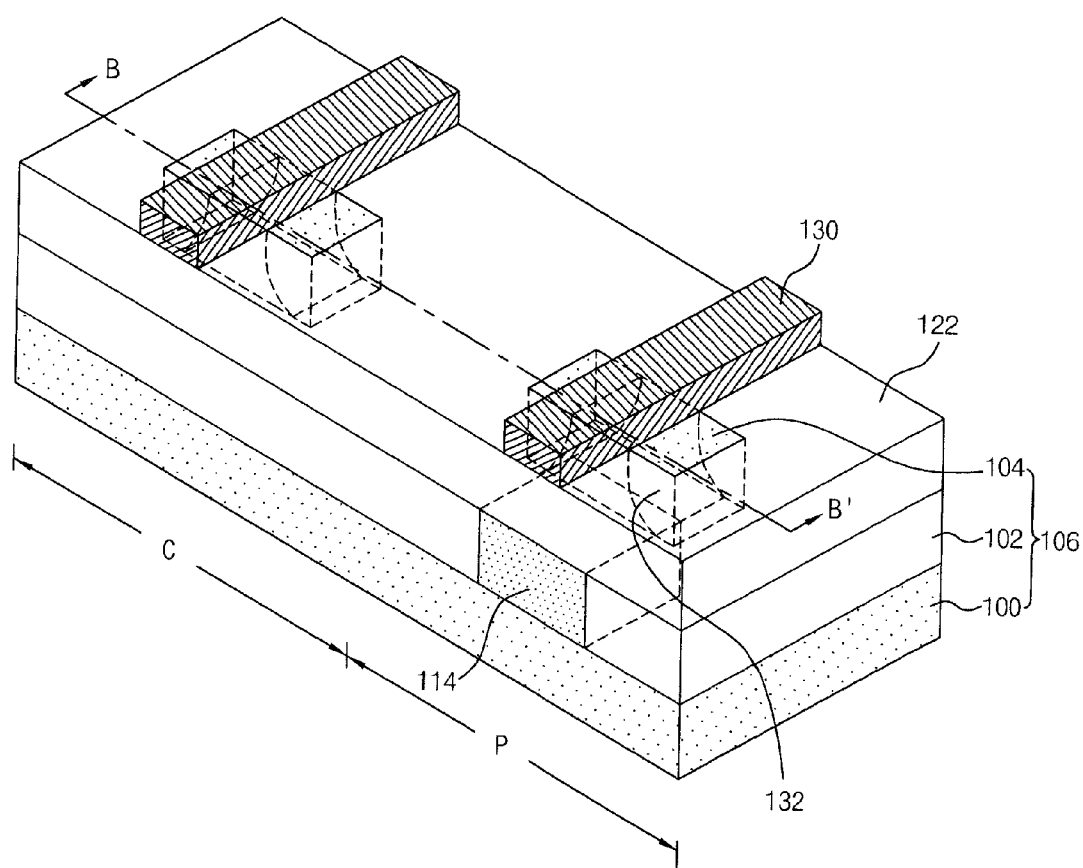
FIG. 1A is a perspective view showing a semiconductor device in accordance with an embodiment of the present invention.
Figure 1B:
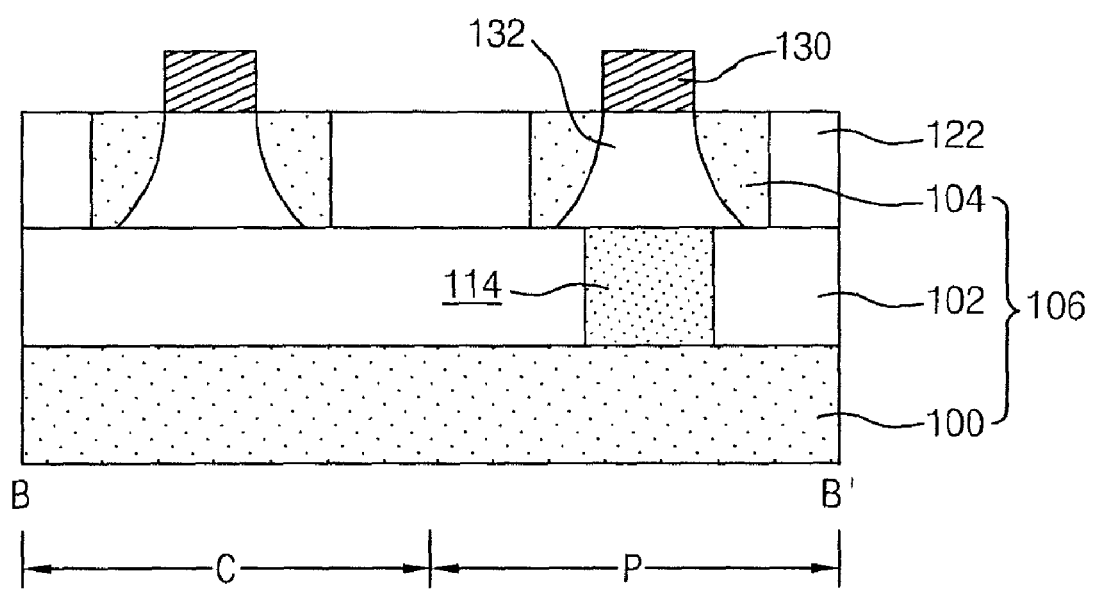
FIG. 1B is a cross-section view taken along line B-B' shown to more clearly depict the arrangement of the elements of the embodiment of the present invention shown in FIG. 1A.

FIG. 1A is a perspective view showing a semiconductor device in accordance with one embodiment of the present invention. FIG. 1B is a cross-section view taken along line A-A' shown to more clearly depict the arrangement of the elements of the embodiment of the present invention shown in FIG. 1A.

Referring to FIGS. 1A and 1B, an SOI substrate 106 having the stack structure of a silicon substrate 100, a buried insulation layer 102, and a silicon layer 104 is prepared. The SOI substrate 106 includes a cell region C and a peripheral region P. An isolation layer 122 is formed to delimit active areas in the silicon layer 104 of the cell region C and the peripheral region P of the SOI substrate 106. Gates 130 are formed on the isolation layer 122 and the silicon layer 104, and junction areas 132 are formed in the silicon layer 104 on sides of the gates 130. In the present embodiment the junction areas 132 are formed at positions corresponding to both sides of the gates 130. The junction areas 132 are formed on the buried insulation layer 102. In the present embodiment the junction areas are formed to come into contact with the buried insulation layer 102.

An epi-silicon layer 114 is formed in a portion of the buried insulation layer 102 in the peripheral region P of the SOI substrate 106 to connect a peripheral portion of the channel area of the silicon layer 104, that is, the body of a transistor, with the silicon substrate 100. The epi-silicon layer 114 is positioned to overlap the peripheral portion of the channel area of the silicon layer 104.

In the semiconductor device according to an embodiment of the present invention, the floating body effect is accomplished in the cell region, in which the epi-silicon layer is not formed, because the body is floated in the cell region. Further, the floating body effect can be prevented in the peripheral region, in which the epi-silicon layer is formed, because the silicon substrate and the body are connected through the epi-silicon layer. Accordingly, the semiconductor device according to the present invention efficiently utilizes the floating body effect and therefore can have improved operation characteristics.

FIGS. 2A through 2L are perspective views of a peripheral region shown for illustrating the processes of a method for manufacturing a semiconductor device in accordance with another embodiment of the present invention.

Figure 2A:
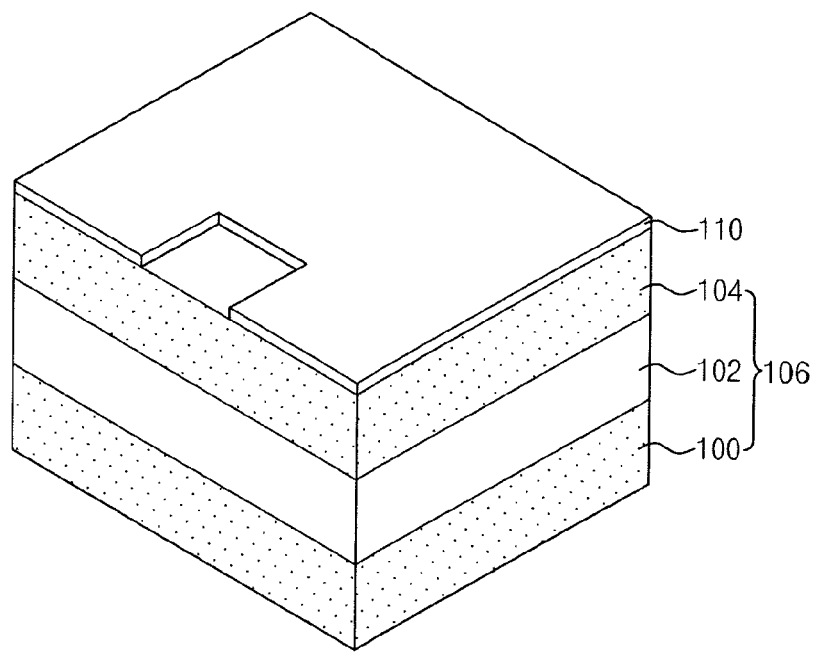
FIGS. 2A through 2L are perspective views of a peripheral region, shown for illustrating the processes of a method for manufacturing a semiconductor device in accordance with another embodiment of the present invention.

Referring to FIG. 2A, an SOI substrate 106 having the stack structure of a silicon substrate 100, a buried insulation layer 102, and a silicon layer 104 is prepared. The SOI substrate 106 includes a cell region and a peripheral region (not shown). A first anti-growth film 110 is formed on the SOI substrate 106 such that a portion of the silicon layer 104 is exposed. The first anti-growth film 110 may be formed as a nitride layer to a thickness in the range of 30~100 Å. The first anti-growth film 110 is formed such that a peripheral portion of the active area of the silicon layer 104 is exposed.

Figure 2B:
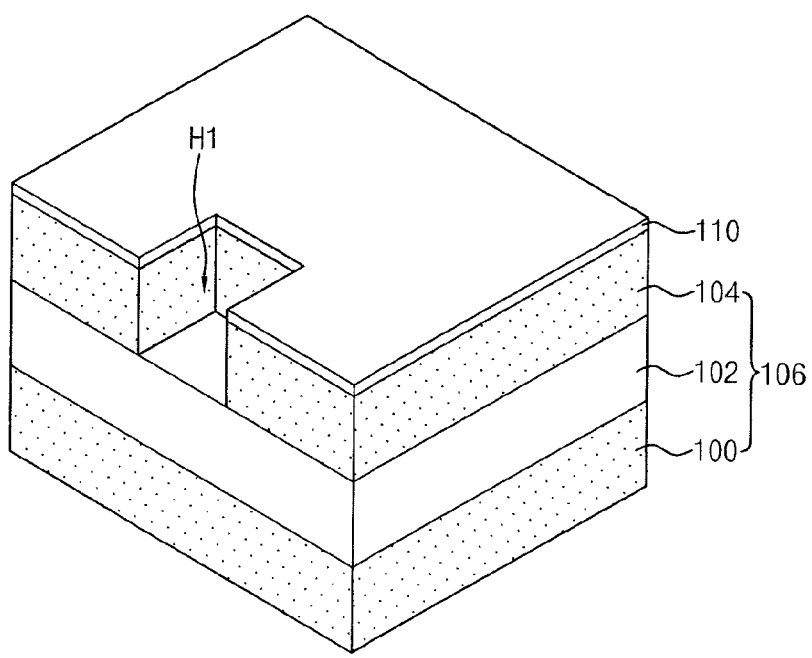

Referring to FIG. 2B, the exposed portion of the silicon layer 104 is etched to define a first groove H1 in the silicon layer 104 and to expose the buried insulation layer 102.

Figure 2C:
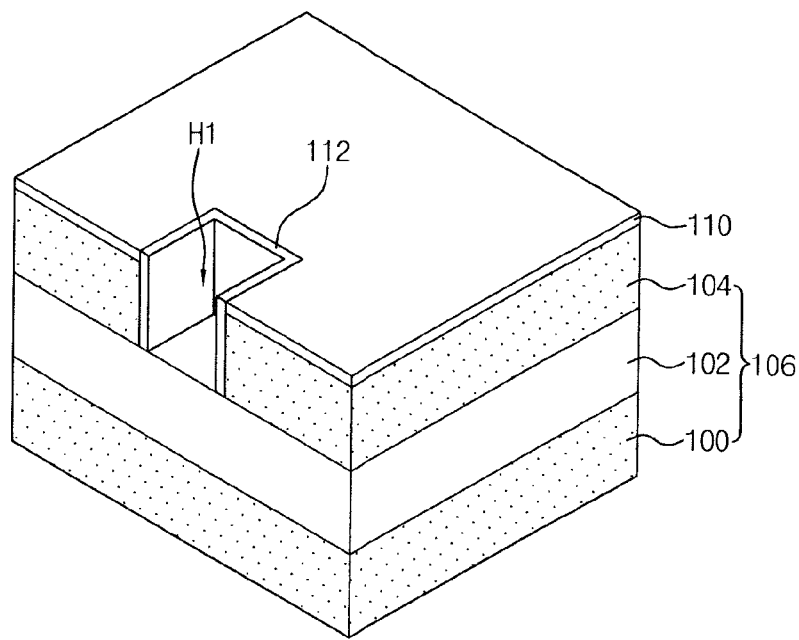

Referring to FIG. 2C, a second anti-growth film 112 is formed on the sidewalls that define the first groove H1 such that the buried insulation layer 102 is exposed on the bottom of the first groove H1. The second anti-growth film 112 may be formed as a nitride layer to a thickness in the range of 30~100 Å. For example, the second anti-growth film 112 may be formed by depositing a nitride layer in the first groove H1 and on the first anti-growth film 110 and then etching back the nitride layer until the first anti-growth film is exposed.

Figure 2D:
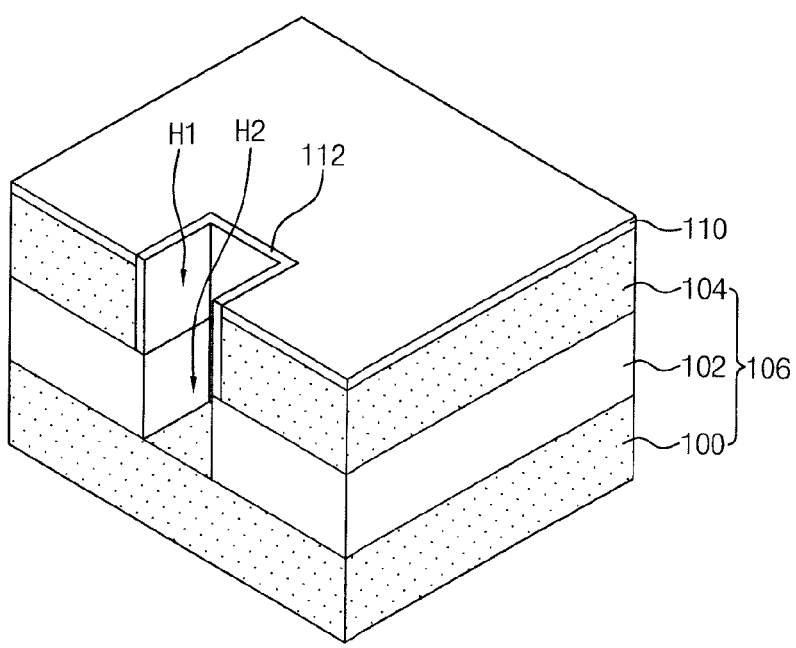

Referring to FIG. 2D, the portion of the buried insulation layer 102 exposed on the bottom of the first groove H1 is etched so as to define a second groove H2 in the buried insulation layer 102 and expose the silicon substrate 100.

Figure 2E:
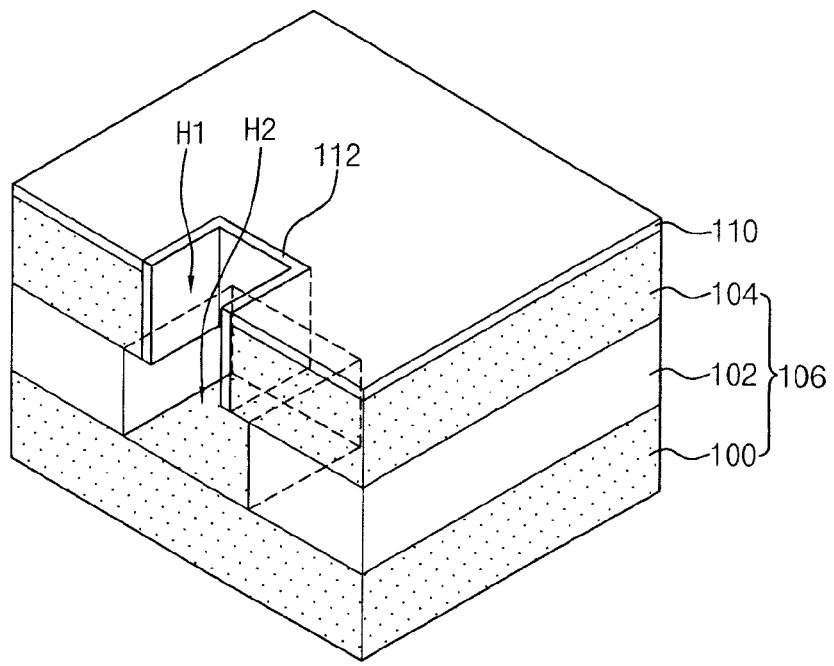

Referring to FIG. 2E, the buried insulation layer 102 is etched such that the width of the second groove H2 is increased to be greater than the width of the first groove H1. The etching of the buried insulation layer 102 is conducted through an isotropic etching. The isotropic etching is conducted, for example, through a wet cleaning process for selectively etching an oxide layer.

Figure 2F:
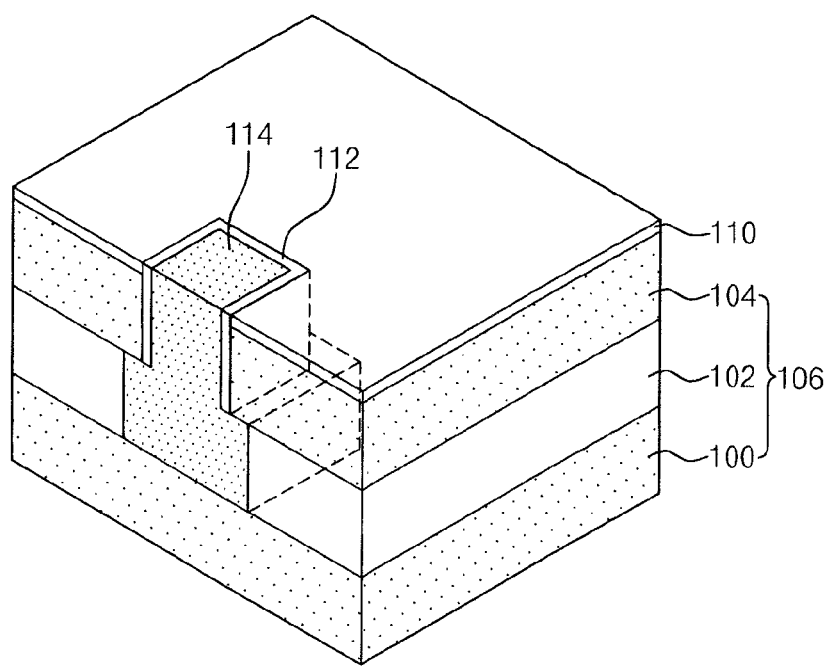

Referring to FIG. 2F, an epi-silicon layer 114 is grown in the first and second grooves H1 and H2 through an selective epitaxial growth (SEG) process. Then, the epi-silicon layer 114 is chemically and mechanically polished (CMPed) until the first anti-growth film 110 is exposed. The epi-silicon layer 114 connects a peripheral portion of the channel area of the silicon layer 104, that is, the body of a transistor, with the silicon substrate 100.

Figure 2G:
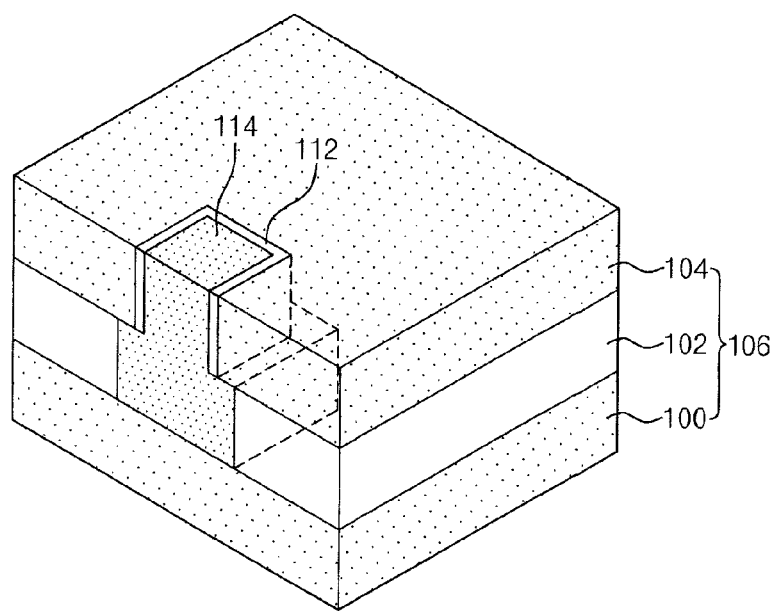

Referring to FIG. 2G, the exposed first anti-growth film 110 is removed, and through this, the silicon layer 104 is exposed. When removing the first anti-growth film 110, a portion of the second anti-growth film 112 may be etched.

Figure 2H:
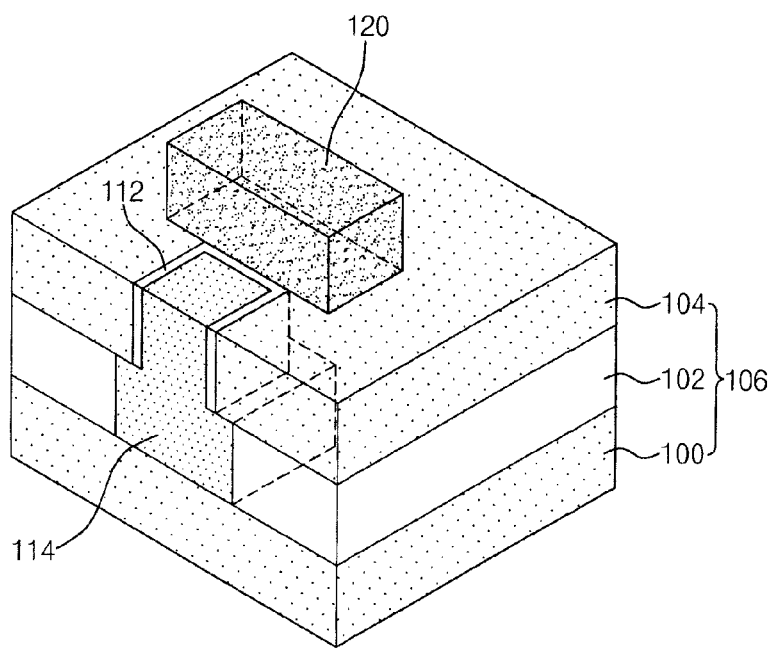

Referring to FIG. 2H, a mask pattern 120 is formed on the exposed silicon layer 104 to cover the active area of the silicon layer 104. The mask pattern 120 is formed to overlap the peripheral portion of the epi-silicon layer 114 grown in the second groove H2, i.e., the previously widened portion of the second groove H2.

Figure 2I:
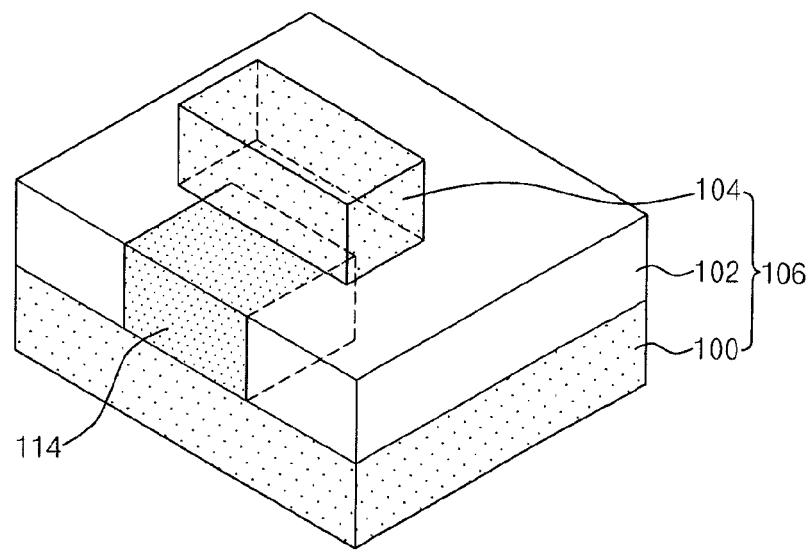

Referring to FIG. 2I, the silicon layer 104, the second anti-growth film 112, and the epi-silicon layer 114 are etched using the mask pattern 120 as an etch mask, and subsequently, the mask pattern 120 is removed. As a result of the etching, a portion of the silicon layer 104 remains to overlap and be connected with the peripheral portion of the epi-silicon layer 114 grown in the second groove H2. Here, the remaining portion of the silicon layer 104 serves as the active area. Therefore, the peripheral portion of the channel area in the active area composed of the silicon layer 104 overlaps with and is connected with the peripheral portion of the epi-silicon layer 114.

Figure 2J:
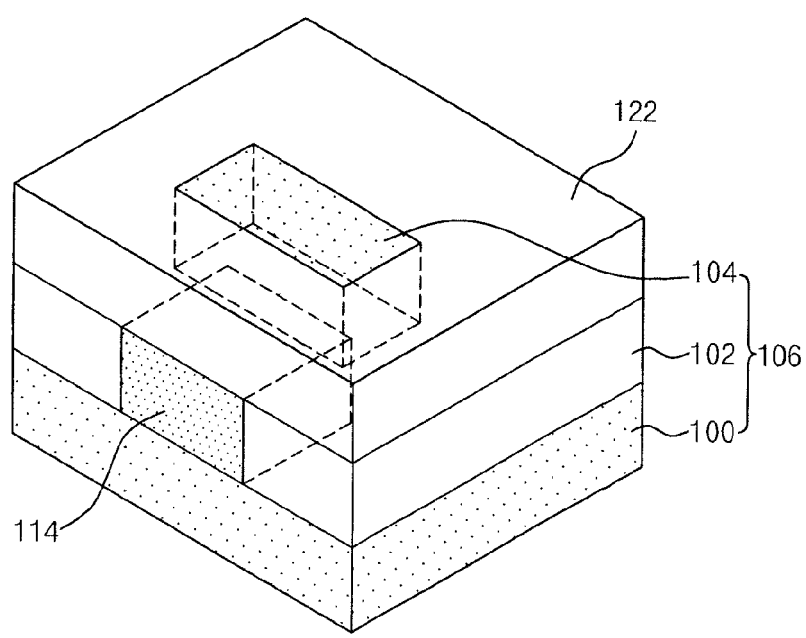

Referring to FIG. 2J, an isolation layer 122 is formed on the buried insulation layer 102 and the epi-silicon layer 114 to delimit the active area composed of the silicon layer 104. As a result, the peripheral portion of the channel area in the active area delimited by the isolation layer 122 is connected with the silicon substrate 100 through the epi-silicon layer 114.

Figure 2K:
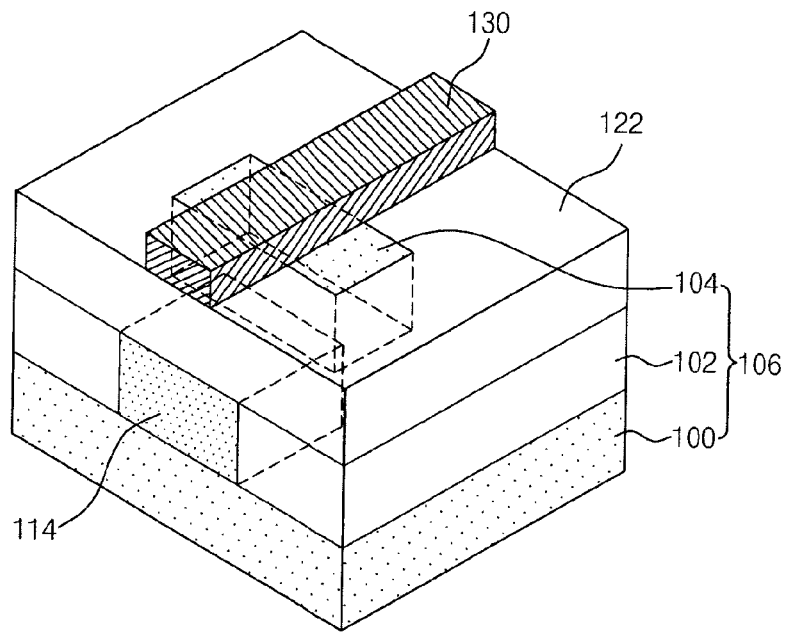

Referring to FIG. 2K, a gate 130 is formed on the isolation layer 122 and the silicon layer 104. The gate 130 is formed on the silicon layer 104, having the peripheral portion which is connected with the epi-silicon layer 114.

Figure 2L:
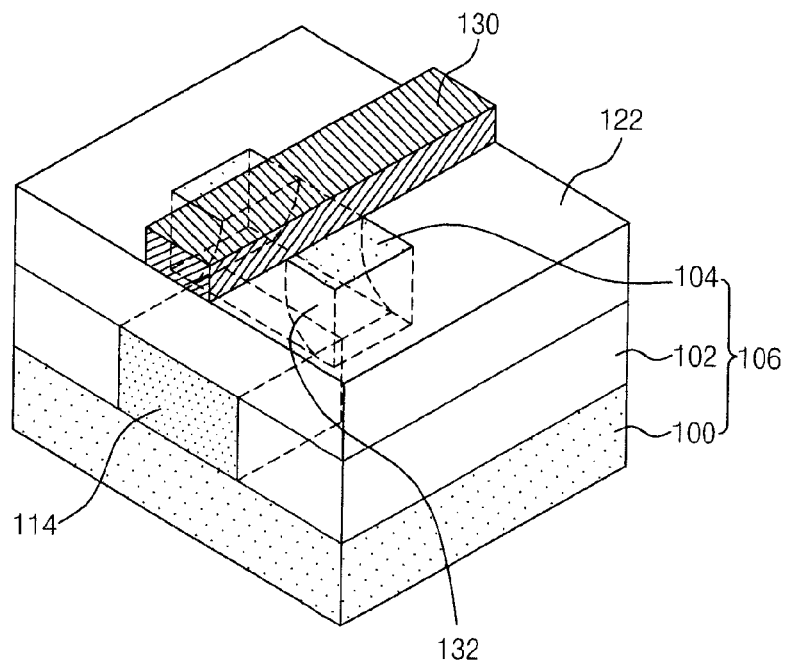

Referring to FIG. 2L, junction areas 132 are formed in the silicon layer 104 on both sides of the gate 130 so as to come into contact with the buried insulation layer 102, and through this, a transistor is formed. Here, in the transistor of the peripheral region, according to the present invention, since the peripheral portion of the channel area of the silicon layer 104 is connected with the silicon substrate 100 through the epi-silicon layer 114, electron holes generated when the transistor of the peripheral region operates can be discharged to the silicon substrate 100, whereby a floating body effect can be prevented from occurring.

Thereafter, while not shown in the drawings, by sequentially conducting a series of well-known subsequent processes, the manufacture of a semiconductor device according to an embodiment of the present invention is completed.

As is apparent from the above description, in the present invention, a floating body effect can be accomplished in a cell region of a semiconductor device by floating the bodies of transistors. Further, the floating body effect can be prevented in a peripheral region of the semiconductor device by connecting the bodies of transistors with a silicon substrate through an epi-silicon layer.

Therefore, in the present invention, electron holes generated when the transistors in the peripheral region of the semiconductor device operate can be discharged to the silicon substrate, and according to this, it is possible to prevent misoperation which is caused due to the temporary discharge of the electron holes to source areas, whereby the operation characteristics of the transistors in the peripheral region can be improved.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. A method for manufacturing a semiconductor device, comprising the steps of:
   preparing an SOI substrate having a cell region and a peripheral region, the SOI substrate being a stack structure comprising:
      a silicon substrate;
      a buried insulation layer; and
      a silicon layer;
   forming an epi-silicon layer in the buried insulation layer of the peripheral region to connect a peripheral portion of a channel area of the silicon layer with the silicon substrate,
      wherein forming the epi-silicon layer comprises:
         etching the silicon layer and the buried insulation layer in the peripheral region to define a groove therein exposing the silicon substrate,
         wherein defining the groove comprises:
            forming a first anti-growth film on the silicon layer exposing a portion of the silicon layer in the peripheral region;
            etching the exposed portion of the silicon layer to expose the buried insulation layer and define a first groove in the silicon layer;
            forming a second anti-growth film on sidewalls of the first groove;
            etching an exposed portion of the buried insulation layer to expose the silicon substrate and define a second groove in the buried insulation layer; and
            etching the buried insulation layer having the second groove defined therein such that the second groove has a width greater than that of the first groove; and
   forming a gate on the silicon layer; and
   forming junction areas in the silicon layer at positions corresponding to sides of the gate.

2. The method according to claim 1, wherein the epi-silicon layer is formed such that at least a portion of the epi-silicon layer overlaps the peripheral portion of the channel area of the silicon layer.

3. The method according to claim 1, wherein the first anti-growth film comprises a nitride layer and the second anti-growth film comprises a nitride layer.

4. The method according to claim 1, wherein the first anti-growth film is formed to a thickness in the range of 30~100 Å and the second anti-growth film is formed to a thickness in the range of 30~100 Å.

5. The method according to claim 1, wherein the step of etching the buried insulation layer having the second groove defined therein is implemented through isotropic etching.

6. The method according to claim 5, wherein the isotropic etching comprises a wet cleaning process.

7. The method according to claim 1, wherein the step of growing the epi-silicon layer comprises a selective epitaxial growth process.

8. The method according to claim 1, further comprising the step of:
   after the step of growing the epi-silicon layer, removing the epi-silicon layer through a CMP process until the silicon layer is exposed.

9. The method according to claim 1, further comprising the step of:
   after the step of growing the epi-silicon layer and before the step of forming the gate, forming an anti-growth film on the buried insulation layer to delimit an active area in the silicon layer, wherein the peripheral portion of the channel area of the silicon layer is connected with the epi-silicon layer.

10. The method according to claim 1, wherein the junction areas are formed to be connected to the buried insulation layer.

* * * * *